(12) United States Patent
Murazaki et al.

(10) Patent No.: US 7,807,071 B2
(45) Date of Patent: *Oct. 5, 2010

(54) LIGHT EMITTING APPARATUS

(75) Inventors: Yoshinori Murazaki, Komatsushima (JP); Yoshiki Sato, Anan (JP)

(73) Assignee: Nichia Corporation, Anan (JP)

( * ) Notice: Subject to any disclaimer, the term of this patent is extended or adjusted under 35 U.S.C. 154(b) by 375 days.

This patent is subject to a terminal disclaimer.

(21) Appl. No.: 11/882,591

(22) Filed: Aug. 2, 2007

(65) Prior Publication Data

US 2008/0030976 A1 Feb. 7, 2008

(30) Foreign Application Priority Data

Aug. 3, 2006 (JP) ............................. 2006-211759

(51) Int. Cl.
*H01L 33/00* (2010.01)

(52) U.S. Cl. ...................... 252/301.4 F; 252/301.4 R; 313/503; 257/98

(58) Field of Classification Search .......... 252/301.4 R, 252/301.4 F; 313/503; 257/98
See application file for complete search history.

(56) References Cited

U.S. PATENT DOCUMENTS

| | | | | |
|---|---|---|---|---|
| 5,998,925 A | * | 12/1999 | Shimizu et al. ............. | 313/503 |
| 7,078,732 B1 | * | 7/2006 | Reeh et al. ..................... | 257/98 |
| 2006/0113906 A1 | * | 6/2006 | Ogawa ........................ | 313/512 |
| 2008/0035887 A1 | * | 2/2008 | Iwao et al. ............ | 252/301.4 F |

FOREIGN PATENT DOCUMENTS

| | | |
|---|---|---|
| JP | 2003-258308 A | 9/2003 |
| JP | 2004-161871 A | 6/2004 |
| WO | WO 2005103199 | * 11/2005 |

* cited by examiner

*Primary Examiner*—C. Melissa Koslow
(74) *Attorney, Agent, or Firm*—Kubovcik & Kubovcik

(57) ABSTRACT

A light emitting apparatus with high emission intensity and that is superior in weather resistance and reliability is obtained. The light emitting apparatus includes a light source and a wavelength-converting member for converting the wavelength of light emitted from the light source, wherein the wavelength-converting member contains a phosphor subjected to a cleaning treatment and/or a coating treatment, in a glass material having a composition of $SiO_2$: 30 to 50%, $Li_2O$: 0 to 15%, $Na_2O$: 0 to 10%, $K_2O$: 0 to 10%, $Li_2O+Na_2O+K_2O$: 20 to 30%, $B_2O_3$: 5 to 15%, $MgO$: 0 to 10%, $BaO$: 0 to 10%, $CaO$: 0 to 10%, $SrO$: 0 to 10%, $Al_2O_3$: 0 to 10%, $ZnO$: 0 to 15%, $TiO_2$: 10 to 20%, $Nb_2O_5$: 1 to 5%, $La_2O_3$: 0 to 5%, and $TiO_2+Nb_2O_5+La_2O_3$: 11 to 20% by mole percentage.

8 Claims, 1 Drawing Sheet

LIGHT EMITTING APPARATUS

BACKGROUND OF INVENTION

Joint Research Agreement

The invention described herein is based on a Joint Research Agreement between Nichia Corporation and Nippon Electric Glass Co., Ltd.

Field of the Invention

The present invention relates to a light emitting apparatus having a wavelength-converting member using a phosphor.

Description of the Related Art

In a wavelength-converting member using a phosphor, light is emitted by mixing phosphor powder, for example, with a molding resin consisting of an organic or an inorganic binder resin that shields a light emitting face of a light emitting element, molding the mixture, absorbing a light emission of the light emitting element, and transforming it to a fixed wavelength. However, in a light emitting device using a light emitting diode etc., when a wavelength-converting member is constituted with a phosphor layer containing an organic binder resin, the organic binder resin itself deteriorates by light of high output in the short wavelength region (the ultraviolet region to the blue region) and there is a problem that emission brightness decreases largely by coloring, etc.

In Japanese Patent Application Laid-Open (JP-A) No. 2004-161871, it is proposed that a mixture of phosphor powder, an organic binder resin, an inorganic sintering assistant and the like is molded into a desired shape, and the organic binder resin that becomes a cause of the deterioration of the phosphor layer is sintered and removed.

In JP-A No. 2003-258308, a wavelength-converting member is proposed in which an inorganic phosphor is dispersed in a glass.

However, there is a case that sufficient weather resistance and reliability cannot be obtained in the method of sintering and removing the organic binder resin. Further, in the case of sintering at high temperature, the phosphor deteriorates or decomposes depending on the type of the phosphor, and there is a case that the emission intensity decreases.

Further, also in the case of dispersing the phosphor into a glass, the phosphor deteriorates or decomposes because the process temperature becomes high, and there is a case that the emission intensity decreases.

SUMMARY OF THE INVENTION

The objective of the present invention is to provide a light emitting apparatus having a wavelength-converting member that has high emission intensity and that is superior in weather resistance and reliability.

The light emitting apparatus of the present invention is a light emitting apparatus including a light source and a wavelength conversion member for converting the wavelength of light emitted from the light source, wherein the wavelength-converting contains a phosphor subjected to a cleaning treatment and/or a coating treatment, in the glass material having a composition of $SiO_2$: 30 to 50%, $Li_2O$: 0 to 15%, $Na_2O$: 0 to 10%, $K_2O$: 0 to 10%, $Li_2O+Na_2O+K_2O$: 20 to 30%, $B_2O_3$: 5 to 15%, MgO: 0 to 10%, BaO: 0 to 10%, CaO: 0 to 10%, SrO: 0 to 10%, $Al_2O_3$: 0 to 10%, ZnO: 0 to 15%, $TiO_2$: 10 to 20%, $Nb_2O_5$: 1 to 5%, $La_2O_3$: 0 to 5%, and $TiO_2+Nb_2O_5+La_2O_3$: 11 to 20% by mole percentage.

In the present invention, a phosphor on which a cleaning treatment and/or a coating treatment are/is performed is used as the phosphor of the wavelength-converting member. By using a phosphor on which a cleaning treatment and/or a coating treatment are/is performed according to the present invention, the emission intensity can be increased.

An example of the cleaning treatment in the present invention is a process of cleaning the surface of phosphor powder with an acid or pure water. An inorganic acid such as nitric acid and hydrochloric acid and an organic acid such as acetic acid can be used as the acid. A concentration of a solution is preferably in the range of 0.1% to 50% in the case of performing cleaning with an acid solution. An example of a method of performing cleaning includes a method of pouring a solution such as an acid, a phosphor, and pure water into a container such as beaker, cleaning by stirring with a stirring rod etc. By performing a cleaning treatment, impurities such as non-reacted raw material and flux existing near the surface of the phosphor powder can be removed, and emission efficiency of the phosphor can be increased.

Further, an example of the coating treatment in the present invention is a process of coating the surface of the phosphor particle with fine particles. Examples of the fine particles include a rare earth element such as Sc, Y, La, Gd, Tb, and Lu, an alkali earth metal element such as Ca and Sr, an oxide of an element such as Nb, Ta, Mo, W, Zn, Sn, Sb, Al, Si, and Ti, orthophosphate, and pyrophosphate. The coating amount is preferably 0.01% by mass to 50% by mass.

An example of a specific method of the coating treatment is a method of performing an annealing treatment in a reduction atmosphere or a neutral atmosphere after mixing and stirring the phosphor particles and the fine particles with a high speed and attaching the fine particles to the surface of the phosphor particle. Examples of the reduction atmosphere include $H_2$ and $NH_3$, and examples of the neutral atmosphere include $N_2$ and Ar. An example of a temperature and time of the annealing treatment is generally 100° C. to 1700° C. and 0.1 hour to 10 hours.

Further, other methods of the coating treatment in the present invention include a surface coating treatment by sol/gel. By performing a coating treatment on the surface of the phosphor particles according to the present invention, the emission intensity of the phosphor can be improved.

In the present invention, the phosphor on which the cleaning treatment and/or the coating treatment are/is performed as described above is included in the glass material of the specific composition described above. Therefore, the wavelength-converting member in the present invention can be manufactured by performing the cleaning treatment and/or the coating treatment on the phosphor and then dispersing the phosphor powder into the glass material by mixing with the glass material of the specific composition described above and melting the glass material.

By including the phosphor into the glass material of the specific composition described above according to the present invention, a wavelength-converting member that is superior in weather resistance and reliability can be made. The glass material of the above-described composition has a low softening point in general, for example, it is 600° C. or less, and preferably in the range of 500° C. to 560° C. By using such glass material, the reaction between the glass and the phosphor when the phosphor is included in the glass material can be reduced, and a wavelength-converting member with high emission intensity can be made by suppressing deterioration or decomposition of the phosphor. Further, by using the glass material as a dispersion medium of the phosphor, a wavelength-converting member that is superior in weather resistance and reliability can be made.

The reason for prescribing each content of the glass component in the above-described glass material is as follows.

SiO$_2$ is a component constituting a skeleton of the glass. When its content becomes less than 30%, chemical durability tends to deteriorate. On the other hand, when it becomes more than 50%, the sintering (calcining) temperature becomes high and the phosphor easily deteriorates. The more preferred range of SiO$_2$ is 35% to 45%.

B$_2$O$_3$ is a component to remarkably improve the melting property by lowering the melting temperature of the glass. When its content becomes less than 5%, this effect becomes difficult to obtain. On the other hand, when it becomes more than 15%, chemical durability tends to deteriorate. The more preferred range of B$_2$O$_3$ is 7% to 14%.

MgO is a component to improve the melting property by lowering the melting temperature of the glass. When its content becomes more than 10%, chemical durability tends to deteriorate. The more preferred range of MgO is 0% to 7%.

CaO is a component to improve the melting property by lowering the melting temperature of the glass. When its content becomes more than 10%, chemical durability tends to deteriorate. The more preferred range of CaO is 0% to 7%.

SrO is a component to improve the melting property by lowering the melting temperature of the glass. When its content becomes more than 10%, chemical durability tends to deteriorate. The more preferred range of SrO is 0% to 7%.

BaO is a component to improve the melting property by lowering the melting temperature of the glass and to suppress a reaction with the phosphor. When its content becomes more than 10%, chemical durability tends to deteriorate. The more preferred range of BaO is 2% to 8%.

Al$_2$O$_3$ is a component to improve chemical durability. When its content becomes more than 10%, the softening point of the glass tends to increase. The more preferred range of Al$_2$O$_3$ is 0% to 7%.

ZnO is a component to improve the melting property by lowering the melting temperature of the glass. When its content is more than 15%, the softening point of the glass tends to increase. The more preferred range of ZnO is 5% to 13%.

Li$_2$O has a large effect to lower the softening point the most among the alkali metal components. Its content is 0 to 15%, preferably 3% to 13%, and further preferably 4% to 12%. When Li$_2$O exceeds 15%, devitrification occurs easily. Furthermore, the amount of alkali elution increases and weather resistance decreases.

Na$_2$O is a component to lower the softening point. Its content is 0% to 10%, and preferably 3% to 8%. When Na$_2$O exceeds 10%, the amount of alkali elution increases and weather resistance decreases.

K$_2$O has an effect to lower the softening point. However, the amount of alkali elution increases and the weather resistance decreases. Because of this, the content of K$_2$O is limited to 0% to 10%, and preferably to 3% to 8%.

Moreover, the total amount of Li$_2$O, Na$_2$O, and K$_2$O, which are alkali metal oxides, is desirably made to 20% to 30% in order to suppress the increase of the softening point and the decrease of weather resistance.

TiO$_2$ is a component to improve weather resistance. Its content is 10% to 20%, and preferably 11% to 17%. When TiO$_2$ exceeds 20%, a crystal having TiO$_2$ as a core becomes easy to deposit and devitrification increases. On the other hand, when it is less than 10%, weather resistance decreases.

Nb$_2$O$_5$ is a component to improve weather resistance while suppressing the deposition of the crystal originated in TiO$_2$. Its content is 1% to 5%, and preferably 2% to 4%. When Nb$_2$O$_5$ exceeds 5%, the crystal formed with TiO$_2$—Nb$_2$O$_5$ becomes easy to deposit, and devitrification increases. On the other hand, when it is less than 1%, the effect to suppress the deposition of the crystal originated in TiO2 becomes small and weather resistance remarkably decreases.

La$_2$O$_3$ is a component to improve weather resistance. Its content is 0% to 5%, and preferably 1% to 4%. When La$_2$O$_3$ exceeds 5%, a crystal having La$_2$O$_3$ as a core becomes easy to deposit and devitrification increases.

Moreover, in order to suppress the decrease of weather resistance, the total amount of TiO$_2$, Nb$_2$O$_5$, and La$_2$O$_3$ is desirably set to 11% to 20%.

Further, besides the above-described components, various components can be added in the range where the main point of the present invention is not spoiled. For example, Sb$_2$O$_3$, P$_2$O$_5$, Ta$_2$O$_5$, Gd$_2$O$_3$, WO$_3$, Bi$_2$O$_3$, ZrO$_2$, etc. may be added.

The phosphor that can be used in the present invention includes an aluminate phosphor activated with cerium (Ce), represented by a general formula M$_3$(Al$_{1-v}$Ga$_v$)$_5$O$_{12}$: Ce (in the formula, M is at least one kind selected from Lu, Y, Gd, and Tb, and v satisfies $0 \leq v \leq 0.8$). By setting v in the above-described range, a phosphor with high emission brightness can be made. The aluminate phosphor in the present invention can emit light of yellow to green by absorbing from near ultraviolet to blue light.

The phosphor that can be used in the present invention includes a nitride phosphor activated with europium (Eu), represented by a general formula M'$_w$Al$_x$Si$_y$B$_z$N$_{(2/3)w+x+(4/3)y+z}$: Eu (in the formula, M' is at least one kind selected from Mg, Ca, Sr, and Ba, and w, x, y, and z satisfy $0.5 \leq w \leq 3$, $x = 1$, $0.5 \leq y \leq 3$, and $0 \leq z \leq 0.5$, respectively). By setting w, x, y, and z in the above-described range, a phosphor with high emission brightness can be made. This nitride phosphor is a phosphor that emits red light by absorbing from near ultraviolet to blue light. The light from near ultraviolet to blue is light of which the peak wavelength is generally in the range of 360 nm to 500 nm. Further, red light is light of which the peak wavelength is generally in the range of 600 nm to 700 nm. Further, the light of green to yellow emitted by the above-described aluminate phosphor is light of which the peak wavelength is generally in the range of 510 nm to 580 nm.

By using the above-described aluminate phosphor and the nitride phosphor in combination as the phosphor, a wavelength-converting member that emits white light can be made.

The content of the phosphor in the wavelength-converting member in the present invention is selected appropriately depending on the type of the phosphor, and is not especially limited. However, in general, it is preferably in the range of 1 to 25% by weight, and more preferably in the range of 8 to 15% by weight. When the content of the phosphor is too much, bubbles generated when the phosphor and a glass material are mixed and sintered tend to remain easily in a sintered body, and as a result, transmissivity decreases and emission intensity easily decreases. Further, when the content of the phosphor is too little, the ratio of excited light becomes too much and chromaticity tends to shift.

The wavelength-converting member in the present invention can be produced by mixing a phosphor and a glass material and sintering this mixed powder at a temperature of the softening point of the glass material or more. A wavelength-converting member of a fixed shape can be manufactured by manufacturing a preformed body of a fixed shape by adding a resin binder depending on necessity and pressure-molding, and by calcining it.

According to the present invention, a wavelength-converting member can be made that has high emission strength and that is superior in weather resistance and reliability.

Therefore, the wavelength-converting member in the present invention can be used as a wavelength-converting member in an emission device in which weather resistivity and reliability are desired such as a signal light, a lighting, a display, and an indicator.

As a light source in the light emitting apparatus of the present invention are used a light emitting diode and a laser diode.

According to the present invention, it is made possible to obtain a light emitting apparatus having high emission intensity and excellent in weather resistance and reliability.

Consequently, the light emitting apparatus of the present invention can be used in the light emitting apparatus required to have weather resistance and reliability such as signal lights, lighting systems, displays, and indicators.

DETAILED DESCRIPTION OF THE PREFERRED EXAMPLES

Figure 1:
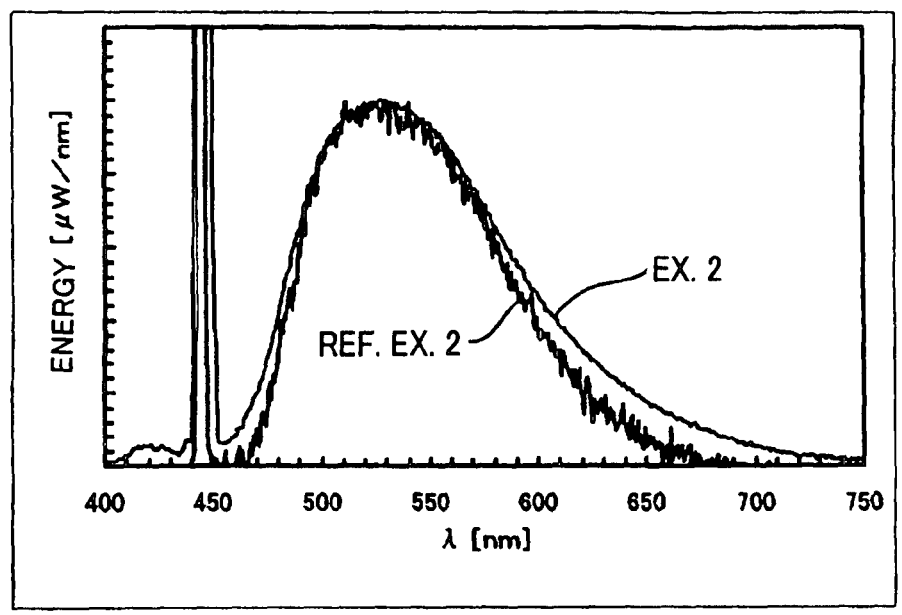
FIG. 1 is a figure showing an emission spectrum of the wavelength-converting member in Example 2 and Reference Example 2 according to the present invention.

The present invention is explained by specific examples below. However, the present invention is not limited to the following examples.

Examples 1 to 9 and Reference Examples 1 to 3

A wavelength-converting member was manufactured using the phosphor and the glass material shown in Table 1 at the compounding ratio shown in Table 1. Specifically, a wavelength-converting member was obtained by sufficiently mixing the phosphor and the glass material shown in Table 1 with a mixing machine and a dry method, filling a crucible with this raw material, calcining it at 540° C. for 20 minutes in an air atmosphere, and molding it into a fixed shape. Moreover, it was heated and calcined at 540° C. for 20 minutes in Reference Example 3.

A LAG phosphor (an aluminate phosphor) of the composition shown below and a CASBN phosphor (a nitride phosphor) of the composition shown below were used as the phosphor.

LAG phosphor: $(Lu_{0.94})_3Al_5O_{12}:Ce_{0.06}$

CASBN phosphor: $Ca_{0.99}Al_{1.00}Si_{1.00}B_{0.10}N_{3.1}:Eu_{0.01}$

Further, "glass in the present invention" having a composition in the range of the present invention shown below and "comparison glass" having a composition out of the range of the present invention were used as the glass material. Moreover, "%" in the glass composition is "mol %".

Glass in the present invention: 40% $SiO_2$-10% $B_2O_3$-10% $TiO_2$-10% $Li_2O$-7% $K_2O$-6% $Na_2O$-3% $Nb_2O_5$-10% ZnO-4% BaO Comparison glass: 11% $SiO_2$-43% $B_2O_3$-11% $Na_2O$-35% ZnO <Treatment of LAG Phosphor>

A cleaning treatment was performed on a LAG phosphor using a nitric acid solution (concentration about 2%) for what is described as "nitric acid cleaning." Specifically, 350 g of dilute nitric acid (60%) was added into 10 liters of pure water and mixed in a fixed container. The LAG phosphor was put in it and stirred. An $Al_2O_3$ coating treatment was performed after performing the above-described nitric acid cleaning on the LAG phosphor for what is described as "nitric acid cleaning.$Al_2O_3$ coating." Specifically, in $Al_2O_3$ coating treatment, the coating treatment was performed by adding 100 g of $Al_2O_3$ fine particles to 1000 g of LAG phosphor on which the nitric cleaning is performed, mixing and stirring these with high speed, and then performing an annealing treatment at 1000° C. for 5 hours in a nitrogen atmosphere.

<Treatment of CASBN Phosphor>

An $Al_2O_3$ coating treatment was performed on a CASBN phosphor in the same manner as the above-described $Al_2O_3$ coating of the LAG phosphor by adding 30 g of $Al_2O_3$ fine particles to 300 g of CASBN phosphor, mixing and stirring with high speed, and then performing an annealing treatment in a nitrogen atmosphere for what is described as "$Al_2O_3$ coating."

A $SiO_2$ coating treatment was performed by adding 30 g of $SiO_2$ fine particles to 300 g of CASBN phosphor, mixing and stirring with high speed, and then performing an annealing treatment at 1000° C. for 5 hours in a nitrogen atmosphere for what is described as "$SiO_2$ coating."

TABLE 1

| | | Phosphor | | |
|---|---|---|---|---|
| | Type | LAG Phosphor | CASBN Phosphor | |
| | | | | Glass Material Glass in Present Invention |
| Example 1 | Treatment | Nitric Acid Cleaning | None | — |
| | Amount Used | 10 g | 2 g | 88 g |
| Example 2 | Treatment | Nitric Acid Cleaning | $Al_2O_3$ Coating | — |
| | Amount Used | 10 g | 2 g | 88 g |
| Example 3 | Treatment | Nitric Acid Cleaning | $Al_2O_3$ Coating | — |
| | Amount Used | 7 g | 3 g | 90 g |
| Example 4 | Treatment | Nitric Acid Cleaning | $SiO_2$ Coating | — |
| | Amount Used | 7 g | 3 g | 90 g |
| Example 5 | Treatment | Nitric Acid Cleaning.$Al_2O_3$ Coating | $Al_2O_3$ Coating | — |
| | Amount Used | 10 g | 2 g | 88 g |
| Example 6 | Treatment | Nitric Acid Cleaning.$Al_2O_3$ Coating | $Al_2O_3$ Coating | — |
| | Amount Used | 7 g | 3 g | 90 g |
| Example 7 | Treatment | Nitric Acid Cleaning | $Al_2O_3$ Coating | — |
| | Amount Used | 10 g | 2 g | 88 g |
| Example 8 | Treatment | Nitric Acid Cleaning | $Al_2O_3$ Coating | — |

TABLE 1-continued

| | | Phosphor | | |
|---|---|---|---|---|
| | Type | LAG Phosphor | CASBN Phosphor | |
| Example 9 | Amount Used | 10 g | 2 g | 88 g |
| | Treatment | Nitric Acid Cleaning | Al$_2$O$_3$ Coating | — |
| Reference Example 1 | Amount Used | 10 g | 2 g | 88 g |
| | Treatment | — | None | — |
| Reference Example 2 | Amount Used | — | 2 g | 98 g |
| | Treatment | None | None | — |
| | Amount Used | 10 g | 2 g | 88 g Glass Material Comparison Glass |
| Reference Example 3 | Treatment | Nitric Acid Cleaning | Al$_2$O$_3$ Coating | — |
| | Amount Used | 10 g | 2 g | 88 g |

[Evaluation of Emission Color and Emission Intensity]

The emission color and the emission intensity were evaluated on each of the obtained wavelength-converting members.

The emission color was evaluated by using a chromaticity meter together with observing visually the color of light coming out through the wavelength-converting member when excited light of wavelength 400 nm was applied to the wavelength-converting member. The measurement results of the emission color distinguished visually and the color coordinate measured with a chromaticity meter are shown in Table 2.

The emission brightness was evaluated by measuring the emission brightness of the light coming out through the wavelength-converting member when excited light of wavelength 460 nm is applied to the wavelength-converting member and making this emission brightness as emission brightness to the emission brightness (100%) in the case of using a wavelength-converting member consisting of a YAG phosphor of a resin seal existing conventionally. It is shown in Table 2 as "relative brightness to YAG (%)."

TABLE 2

| | Emission Color | Color Coordinate x | Color Coordinate y | Relative Brightness to YAG (%) |
|---|---|---|---|---|
| Example 1 | White | 0.333 | 0.325 | 85 |
| Example 2 | White | 0.351 | 0.348 | 96 |
| Example 3 | White | 0.330 | 0.325 | 90 |
| Example 4 | White | 0.348 | 0.335 | 91 |
| Example 5 | White | 0.320 | 0.323 | 88 |
| Example 6 | White | 0.350 | 0.353 | 98 |
| Example 7 | White | 0.349 | 0.347 | 95 |
| Example 8 | White | 0.352 | 0.349 | 96 |
| Example 9 | White | 0.348 | 0.348 | 96 |
| Reference Example 1 | White | 0.653 | 0.332 | 20 |
| Reference Example 2 | White | 0.320 | 0.323 | 82 |
| Reference Example 3 | White | 0.345 | 0.335 | 76 |

As shown in Table 2, it is found that white with a good color phase can be obtained with high emission brightness in the wavelength-converting member of Examples 1 to 9 in which a phosphor on which the cleaning treatment and/or the coating treatment are/is performed according to the present invention is used and this phosphor is included in the glass material with a composition in the range of the present invention.

On the other hand, in the wavelength-converting member in Reference Example 2 using a phosphor on which the cleaning treatment and the coating treatment are not performed and Reference Example 3 using a glass material with a composition outside of the range of the present invention, the decrease of the emission brightness is a little. However, the ASBN phosphor is hardly emitting, and a wavelength-converting member with a good color rendering property cannot be obtained. Further, in Reference Example 1 in which a LAG phosphor is not used, white light with a good color phase cannot be obtained, and the emission brightness become considerably low.

[Measurement of Emission Spectrum]

The emission spectrum was measured on the wavelength-converting member in Example 2 and Reference Example 2. The emission spectrum of light coming out through the wavelength-converting member when excited light of wavelength 460 nm is applied to the wavelength-converting member was measured. The measurement result is shown in FIG. 1.

As shown in FIG. 1, in the wavelength-converting member in Example 2, because the CASBN phosphor on which the coating treatment is performed is used, the CASBN phosphor emits light, and energy intensity around 650 nm that is the emission region of the CASBN phosphor is high. On the other hand, in Reference Example 2, because the coating treatment is not performed on the ASBN phosphor and the CASBN phosphor does not emit light or emits a little light even if it emits light, the energy intensity around 650 nm is low. Moreover, because the amount of the CASBN phosphor added is relatively smaller than the LAG phosphor, a rise does not exist in the emission region like the emission of the LAG phosphor (around 530 nm).

[Light Emission Apparatus]

Figure 2:
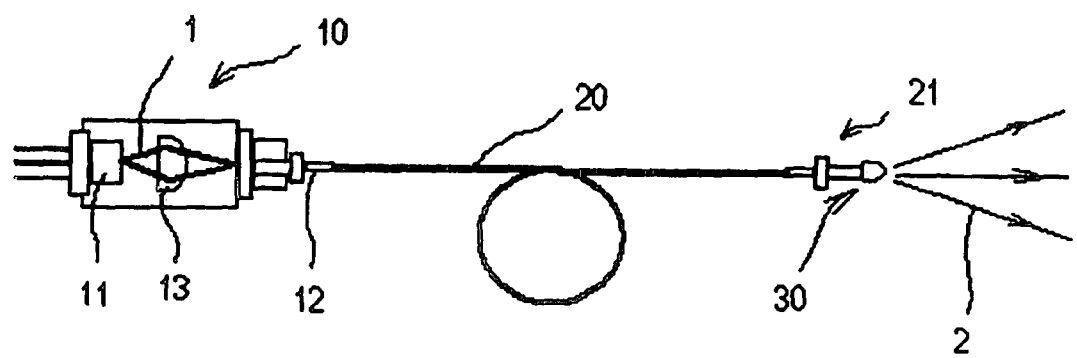
FIG. 2 is a schematic drawing showing a light emitting apparatus of one example according to the present invention

FIG. 2 is a schematic drawing showing one example of a light emitting apparatus of the present invention. In a light source 10, a light emitting device 11 of a laser diode (LD) is installed and the light 1 emitted from the light emitting device 11 passes a lens 13 and is emitted from an emission part 12. One end of an optical fiber 20 is connected to the emission part 12 and a wavelength-converting member 30 is installed in the output part 21, which is the other end of the optical fiber 20. The light emitting device 11 is a GaN type semiconductor device and emits light with wavelength near 405 nm. The wavelength of the light is converted by the wavelength-converting member 30 and incandescent light 2 is radiated from the wavelength-converting member 30.

With respect to the light emitting apparatus shown in FIG. 2, since the wavelength-converting according to the present invention is used, the light emitting apparatus is high emission luminance and excellent in weather resistance and reliability.

What is claimed is:

1. A light emitting apparatus comprising a light source and a wavelength-converting member for converting a wavelength of light emitted from the light source, wherein the wavelength-converting member contains a phosphor subjected to a cleaning treatment and/or a coating treatment, in a glass material having a composition of $SiO_2$: 30 to 50%, $Li_2O$: 0 to 15%, $Na_2O$: 0 to 10%, $K_2O$: 0 to 10%, $Li_2O+Na_2O+K_2O$: 20 to 30%, $B_2O_3$: 5 to 15%, $MgO$: 0 to 10%, $BaO$: 0 to 10%, $CaO$: 0 to 10%, $SrO$: 0 to 10%, $Al_2O_3$: 0 to 10%, $ZnO$: 0 to 15%, $TiO_2$: 10 to 20%, $Nb_2O_5$: 1 to 5%, $La_2O_3$: 0 to 5%, and $TiO_2+Nb_2O_5+La_2O_3$: 11 to 20% by mole percentage.

2. The light emitting apparatus according to claim 1, wherein the wavelength-converting member contains, as the phosphor, an aluminate phosphor activated with cerium (Ce), represented by a general formula $M_3(Al_{1-v}Ga_v)_5O_{12}$: Ce, wherein M is at least one kind selected from Lu, Y, Gd, and Tb, and v satisfies $0 \leq v \leq 0.8$.

3. The light emitting apparatus according to claim 1, wherein the wavelength-converting member contains, as the phosphor, a nitride phosphor activated with europium (Eu), represented by a general formula $M'_w Al_x Si_y B_z N_{((2/3)w+x+(4/3)y+z)}$: Eu, wherein M' is at least one kind selected from Mg, Ca, Sr, and Ba, and w, x, y, and z satisfy $0.5 \leq w \leq 3$, $x=1$, $0.5 \leq y \leq 3$, and $0 \leq z \leq 0.5$, respectively.

4. The light emitting apparatus according to claim 2, wherein the wavelength-converting member contains, as an additional phosphor, a nitride phosphor activated with europium (Eu), represented by a general formula $M'_w Al_x Si_y B_z N_{((2/3)w+x+(4/3)y+z)}$: Eu, wherein M' is at least one kind selected from Mg, Ca, Sr, and Ba, and w, x, y, and z satisfy $0.5 \leq w \leq 3$, $x=1$, $0.5 \leq y \leq 3$, and $0 \leq z \leq 0.5$, respectively.

5. The light emitting apparatus according to claim 1, wherein said light source is a light emission diode or a laser diode.

6. The light emitting apparatus according to claim 2, wherein said light source is a light emission diode or a laser diode.

7. The light emitting apparatus according to claim 3, wherein said light source is a light emission diode or a laser diode.

8. The light emitting apparatus according to claim 4, wherein said light source is a light emission diode or a laser diode.

* * * * *